United States Patent
Muchherla et al.

(10) Patent No.: US 11,762,767 B2
(45) Date of Patent: Sep. 19, 2023

(54) STORING HIGHLY READ DATA AT LOW IMPACT READ DISTURB PAGES OF A MEMORY DEVICE

(71) Applicant: Micron Technology, Inc., Boise, ID (US)

(72) Inventors: Kishore Kumar Muchherla, Fremont, CA (US); Giuseppina Puzzilli, Boise, ID (US); Vamsi Pavan Rayaprolu, San Jose, CA (US); Ashutosh Malshe, Fremont, CA (US); James Fitzpatrick, Laguna Niguel, CA (US); Shyam Sunder Raghunathan, Singapore (SG); Violante Moschiano, Avezzano (IT); Tecla Ghilardi, Trescore Balneario (IT)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 17/302,064

(22) Filed: Apr. 22, 2021

(65) Prior Publication Data
US 2022/0342813 A1  Oct. 27, 2022

(51) Int. Cl.
*G06F 12/00* (2006.01)
*G06F 12/02* (2006.01)
(Continued)

(52) U.S. Cl.
CPC ...... *G06F 12/0269* (2013.01); *G11C 16/3418* (2013.01); *G11C 29/52* (2013.01); *G06F 2212/702* (2013.01); *G11C 16/0483* (2013.01)

(58) Field of Classification Search
CPC ............. G06F 12/0875; G06F 12/0269; G06F 2212/604; G06T 1/20; G06T 1/60
See application file for complete search history.

(56) References Cited

U.S. PATENT DOCUMENTS

| | | | |
|---|---|---|---|
| 9,007,825 B2 * | 4/2015 | Camp | G11C 16/3427 365/189.16 |
| 10,373,695 B2 * | 8/2019 | Barndt | G11C 16/3431 |

(Continued)

OTHER PUBLICATIONS

'Read disturb-aware write scheduling and data reallocation in SSDs' Bowen et al. IEICE Electronics Express, vol. 17, No. 8, 1-6 (Year: 2020).*

*Primary Examiner* — Shawn X Gu
*Assistant Examiner* — Mohammad S Hasan
(74) *Attorney, Agent, or Firm* — LOWENSTEIN SANDLER LLP

(57) ABSTRACT

A highly read data manager of a memory device receives a request to perform receives a request to perform a data relocation operation on a first wordline of a plurality of wordlines for a memory device, the memory device comprising a plurality of multi-level memory cells, wherein each multi-level memory cell comprises a plurality of pages; determines at the first wordline comprises data stored at one or more high read disturb pages of the plurality of pages; determines whether the data comprises a characteristic that satisfies a threshold criterion in relation to additional data stored on additional wordlines of the plurality of wordlines; responsive to determining that the data comprises the characteristic that satisfies the threshold criterion, identifies one or more low read disturb pages of the plurality of pages of a target wordline for relocating the data; and responsive to identifying the one or more low read disturb pages of the target wordline, stores at least a portion of the data at the one or more low read disturb pages of the target wordline.

20 Claims, 6 Drawing Sheets

(51) Int. Cl.
*G11C 29/52* (2006.01)
*G11C 16/34* (2006.01)
*G11C 16/04* (2006.01)

(56) References Cited

U.S. PATENT DOCUMENTS

| | | | |
|---|---|---|---|
| 2012/0233391 A1* | 9/2012 | Frost | G06F 12/1009 |
| | | | 711/E12.008 |
| 2014/0173239 A1* | 6/2014 | Schushan | G11C 16/349 |
| | | | 365/185.02 |
| 2017/0139761 A1* | 5/2017 | Song | G06F 12/02 |
| 2018/0188981 A1* | 7/2018 | Alavi | G11C 16/349 |
| 2018/0190362 A1* | 7/2018 | Barndt | G06F 3/0619 |
| 2020/0278800 A1* | 9/2020 | Buxton | G06F 3/0679 |
| 2021/0026733 A1* | 1/2021 | Lee | G06F 11/0787 |

* cited by examiner

STORING HIGHLY READ DATA AT LOW IMPACT READ DISTURB PAGES OF A MEMORY DEVICE

TECHNICAL FIELD

Embodiments of the disclosure relate generally to memory sub-systems, and more specifically, relate to storing highly read data at low impact read disturb pages of memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
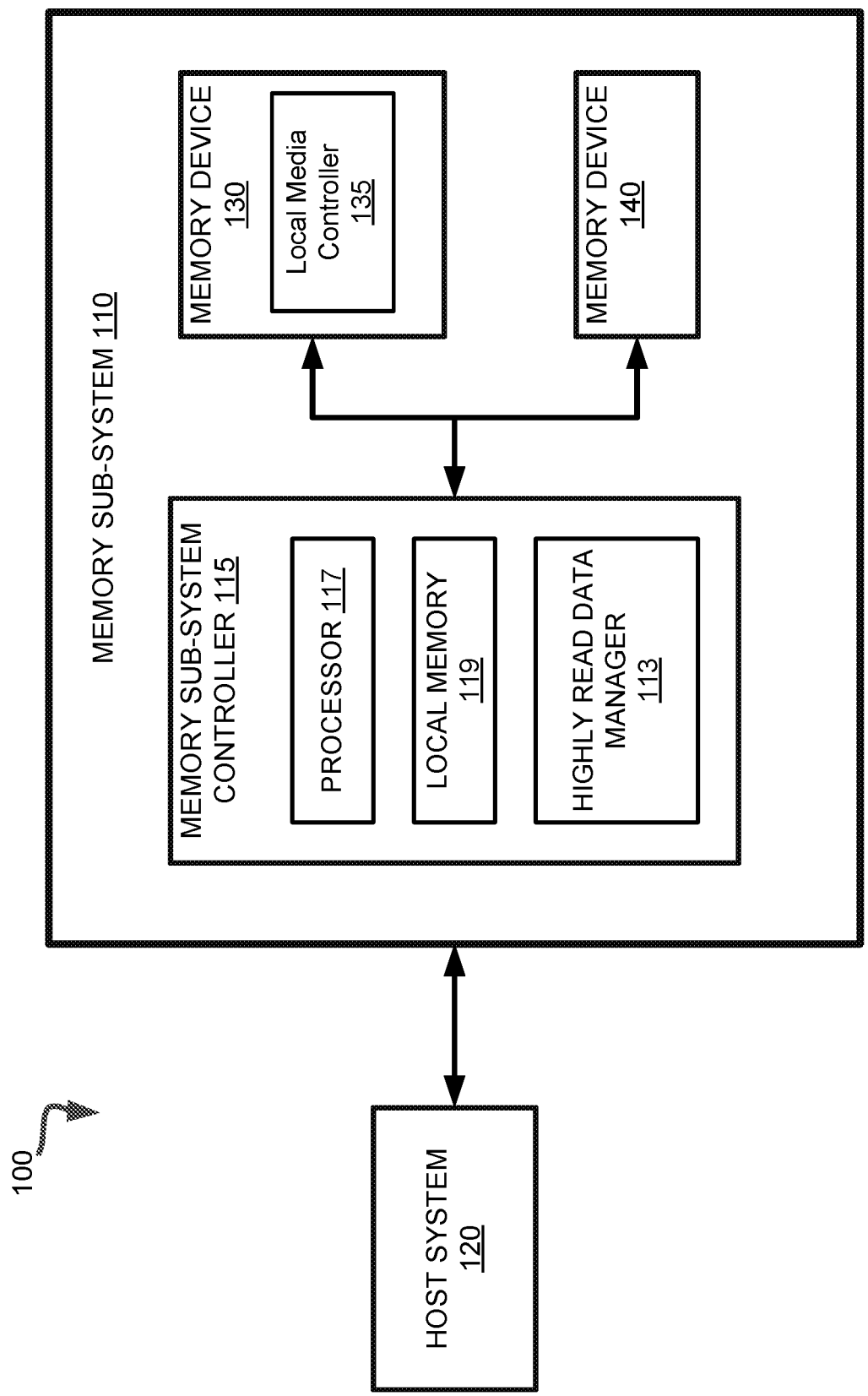
FIG. 1 illustrates an example computing system that includes a memory sub-system in accordance with some embodiments of the present disclosure.

Aspects of the present disclosure are directed to accelerating configuration updates for memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Memory devices can include multi-level memory cells. Each multi-level memory cell can be configured with different page levels, where each page level can be used to store a particular significant bit level for the memory cell. For example, a memory device configured with multi-level cells (MLCs) can store two bits per cell. In such instances, an MLC can include a lower page for programming a least significant bit and a higher page (or upper page) for programming a most significant bit for the MLC. Similarly, a memory device configured with triple-level cells (TLCs) can store three bits per cell. In such instances, a TLC can include a lower page for programming a least significant bit and a multiple higher pages—an upper page for programming a second significant bit and an extra page for programming the most significant bit for the TLC.

In conventional memory sub-systems, data can be read and read as a series of wordlines within a block. Typically, when reading the data from the memory cells of a wordline, a particular pass voltage is applied to that wordline to perform the read operation. At the same time, a higher voltage level is applied to wordlines that are adjacent to the wordline being read. This higher voltage causes the memory cells of the adjacent wordlines to appear transparent to the memory sub-system so that they do not interfere with the read operation. In some instances, particular wordlines can include data that is read much more often than data stored in other wordlines in a particular data block. This heavily accessed data can typically be referred to as "highly read" or "hot read" data.

Wordlines that include highly read data can have parasitic effects on adjacent wordlines, since repeated reads of a particular wordline can cause repeated application of higher pass voltages to those adjacent wordlines. This can result in a condition known as read disturb. Read disturb is an error condition that can occur when one or more bits are changed during a read operation, causing an increase in raw bit error rate (RBER) for those bits. As noted above, unselected wordlines can experience high levels of read disturb stress due to the repeated application of higher voltages applied to these wordlines during read operations. The severity of read disturb on adjacent wordlines can be significantly increased when the data being repeatedly read is stored in pages of the memory cells having suffered more read stress than other pages (i.e., "high read disturb pages). In conventional systems this is due to the large difference between the voltage necessary to conduct a read of data from certain pages (e.g., lower pages (least significant bits) and the high pass voltage applied to the unselected adjacent wordlines. The significant increase in read disturb experienced by the unselected pages can result in significant increase in bit error rates over a shorter period of time. This can, in turn, lead to a decrease in both data reliability and performance, as well as a significantly shorter lifespan for the memory device.

Conventional memory sub-systems do not make significant attempts to mitigate these issues, opting instead to perform garbage collection and/or folding operations more often. Additionally, when performing these operations, conventional systems typically move all valid data sequentially to another location. These solutions do not typically take into account the causes of read disturb degradation.

Aspects of the present disclosure address the above and other deficiencies by storing highly read data at low impact read disturb pages of a memory device. In one embodiment, a highly read data manager of the memory sub-system controller can receive a request to perform a data relocation operation (e.g., a garbage collection operation, a data folding operation, etc.). The highly read data manager can determine whether the data selected for relocation is highly read data, and if so intelligently select target wordlines for relocating the highly read data to reduce the read disturb impact to adjacent wordlines. Additionally, the highly read data manager can store the highly read data on the pages having suffered the least amount of read disturb or a lower amount of read disturb than other pages (i.e., "low read disturb pages") of the memory cells of the target wordlines to significantly reduce the impact of applying higher voltages to the unselected adjacent wordlines. In another embodiment, the highly read data manager can receive a request to write new data to the memory device, where the write request specifies that the data will be highly read. The highly read data manager can utilize a similar process for identifying low read disturb pages of target wordlines for writing the highly read data in order to reduce read disturb effects on the unselected adjacent wordlines.

Advantages of the present disclosure include, but are not limited to, significantly reducing the read disturb impact of highly read data on adjacent unselected wordlines. By proactively identifying data that is highly read and locating that data to low read disturb pages of target memory cells, the differences between the pass voltages applied to adjacent wordlines can be significantly reduced. This can significantly reduce the read disturb impact caused by highly read data on the unselected adjacent wordlines. Additionally, by reducing the overall read disturb impact, the reliability and performance of the memory device can be significantly improved since the memory device can tolerate higher read disturb before performing a garbage collection operation or folding operation. This, in turn, can result in significantly lower write amplification which can further improve the performance and reliability of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 can include a highly read data manager 113 that can be used to relocate and/or store highly read data at low impact read disturb pages of memory device 130. In some embodiments, the memory sub-system controller 115 includes at least a portion of the highly read data manager 113. In some embodiments, the highly read data manager 113 is part of the host system 110, an application, or an operating system. In other embodiments, local media controller 135 includes at least a portion of highly read data manager 113 and is configured to perform the functionality described herein.

In various implementations, highly read data manager 113 can receive a request to perform a data relocation operation on data stored on a source wordline of a data block for memory devices 130, 140. The relocation operation can be a garbage collection operation, a data folding operation, or the like. Memory devices 130, 140 can include multi-level memory cells. Each multi-level memory cell can be configured with different page levels, where each page level can be used to store a particular significant bit level for the memory cell. For example, a memory device configured with multi-level cells (MLCs) can store two bits per cell. In such instances, an MLC can include a lower page for programming a least significant bit and a higher page (or upper page) for programming a most significant bit for the MLC. Similarly, a memory device configured with triple-level cells (TLCs) can store three bits per cell. In such instances, a TLC can include a lower page for programming a least significant bit and a multiple higher pages—an upper page for programming a second significant bit and an extra page for programming the most significant bit for the TLC. In other embodiments, the memory device can be configured as any other memory type, such as quad-level cell (QLC) memory, penta-level cell (PLC) memory, etc., or memory storing a non-integer number of bits per cell (e.g., 3.5 bits per cell, 4.5 bits per cell).

Responsive to receiving the request, the highly read data manager 113 can determine that a source wordline to be relocated includes data stored at high read disturb pages of that wordline. The highly read data manager 113 can then determine whether the data of that source wordline is highly read (or "hot read") data. As described in further detail below, the highly read data manager 113 can make this determination by analyzing the memory cells of wordlines adjacent to the source wordline. If the highly read data manager 113 determines that the data stored in the source wordline is highly read data, one or more target wordlines of a target data block can be identified to store the relocated data. Subsequently, highly read data manager 113 can store the data in the low read disturb pages of the target wordline or wordlines.

In some implementations, highly read data manager 113 can be invoked in response to receiving a write request from a host system to write new data to memory devices 130, 140. In such instances, the received request can include an indication that the data to be written to memory devices 130, 140 is data that will be highly read. The highly read data manager 113 can utilize a similar process as that described above (and as further described below with respect to FIG. 4) to identify one or more target wordlines in a target data block to store the data. Subsequently, the highly read data manager 113 can store the data in the low read disturb pages of the identified target wordlines.

Further details with regards to the operations of the highly read data manager 113 are described below with respect to FIGS. 2-4.

Figure 2:
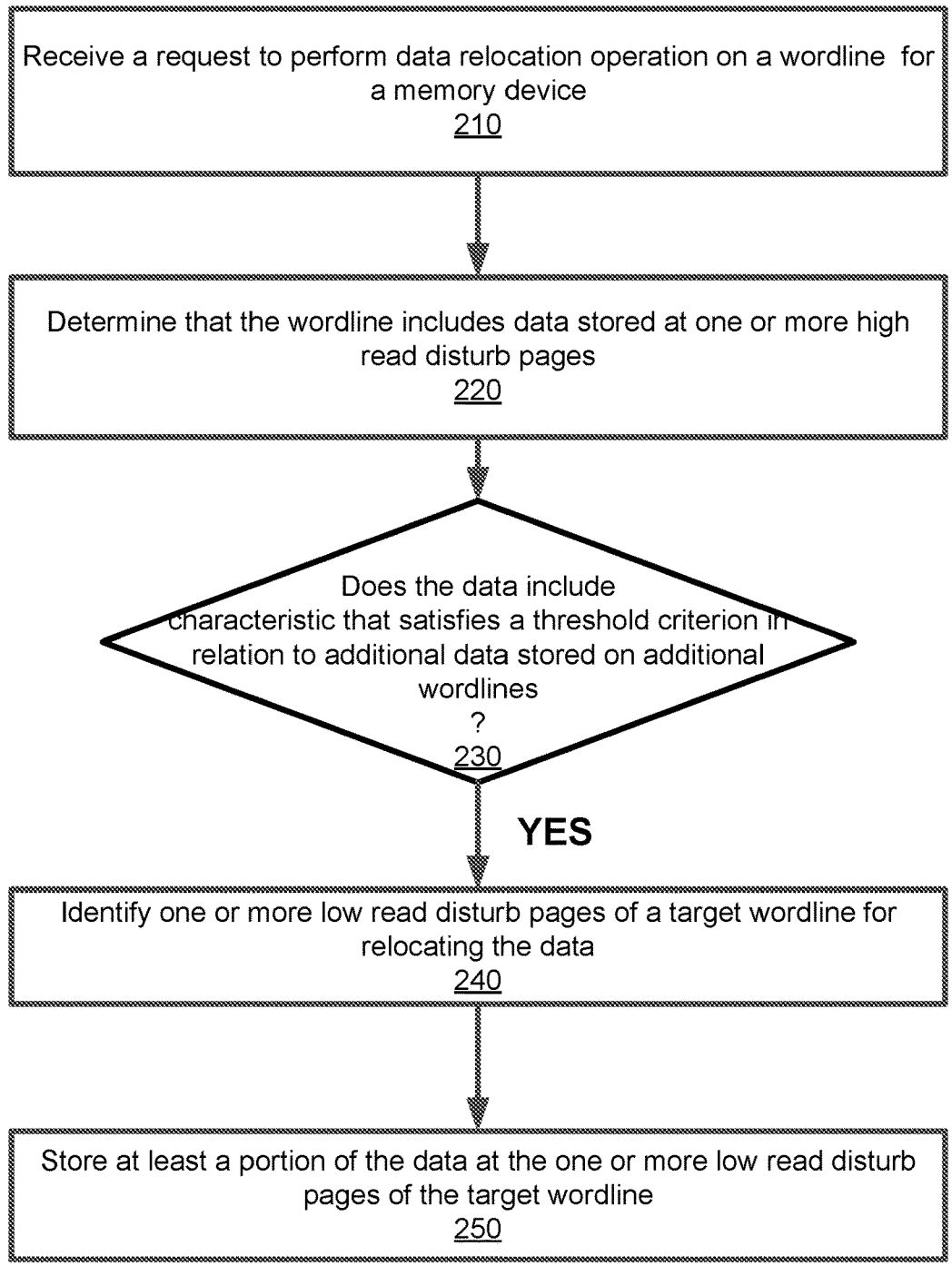
FIG. 2 is a flow diagram of an example method to facilitate relocating highly read data to low impact read disturb pages of a memory device, in accordance with some embodiments of the present disclosure.

FIG. 2 is a flow diagram of an example method 200 to facilitate relocating highly read data to low impact read disturb pages of a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the highly read data manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives a request to perform a data relocation operation on a wordline for a memory device (e.g., memory device 130 in FIG. 1). In some implementations, the relocation operation can be part of a memory management operation, such as a garbage collection operation to relocate data from one data block stripe of the memory device to a new destination block stripe of that memory device. The request to perform the garbage collection operation, or other memory management operation, can be initiated responsive to determining that data consolidation is to be performed on a candidate data block to free up memory resources for subsequent program/erase cycles. In other implementations, the data relocation operation can be a folding operation to migrate data from one memory device location to another memory device location. The request to perform the folding operation can be initiated to pack valid data together, which can free more memory device storage space for additional programming operations, error avoidance operations, wear leveling operations, or the like. In some implementations, a folding operation can be performed as a part of a garbage collection operation. In various implementations, the request can be initiated responsive to detecting a high error rate for a particular data block for the memory device, detecting a high level of read disturb for wordlines of a particular data block for the memory device, or the like.

As noted above, the memory device can include multi-level memory cells. Each multi-level memory cell can be configured with different page levels, where each page level can be used to store a particular significant bit level for the memory cell. For example, a memory device configured with multi-level cells (MLCs) can store two bits per cell. In such instances, an MLC can include a lower page for programming a least significant bit and a higher page (or upper page) for programming a most significant bit for the MLC. Similarly, a memory device configured with triple-level cells (TLCs) can store three bits per cell. In such instances, a TLC can include a lower page for programming a least significant bit and a multiple higher pages—an upper page for programming a second significant bit and an extra page for programming the most significant bit for the TLC.

At operation 220, the processing logic determines that the first wordline includes data stored at one or more high read disturb pages. In various implementations, the processing logic can analyze the wordlines of the data block to be relocated and prior to relocating the data determine whether the data of a particular wordline is programmed at high read disturb pages or low read disturb pages of the memory cells. As noted above, since data stored at high read disturb pages can cause a significantly higher level of read disturb in adjacent wordlines, the processing logic can identify those wordlines with data stored at high read disturb pages to facilitate efficient relocation of highly read data.

At operation 230, the processing logic determines whether the data stored at the high read disturb pages of the source wordline includes data characteristic that satisfies a threshold criterion in relation to data stored on other wordlines in the source data block for the memory device. In various implementations, the threshold criterion can be associated with data that is actively read, highly read, hot read, etc. In other words, determining that the data characteristic satisfies the threshold can indicate that the data is highly read. As noted above, since data stored at high read disturb pages of one wordline can cause higher levels of read disturb in adjacent wordlines, highly read data can significantly increase the read disturb effects on the adjacent wordlines. In some implementations, processing logic can make this determination based on the number of read operations performed on the data for a wordline. In such instances, the processing logic can determine a read count associated with the source wordline where the read count includes an indication of the number of host read operations performed on the memory cells of that wordline.

The memory sub-system controller can maintain one or more counters associated with read operations performed on the memory device. In various implementations, the counter(s) can be maintained based on different levels of granularity. For example, the counter can track read operations performed on particular data blocks, logical block addresses (LBAs), wordline addresses, or the like. The processing logic can determine the read count using the counter(s) maintained by the sub-system controller. Once the read count has been determined, the processing logic can determine whether the read count satisfies a read threshold criterion associated with a highly read data condition. In various implementations, the read threshold criterion can specify a particular number of read operations performed, a percentage of read operations performed on the source wordline in relation to total read operations performed on the data block, a percentage of read operations performed on the source wordline in relation to adjacent wordlines, or the like. Responsive to determining that the number of read operations performed on the source wordline satisfies the threshold, the processing logic can determine that the source wordline includes highly read data. Otherwise, the processing logic can determine that the source wordline does not include highly read data.

In some implementations, the processing logic can determine whether the source wordline includes data that includes the characteristic that satisfies the threshold criterion (e.g., that the wordline includes highly read data) based on the detected level of read disturb in adjacent wordlines, which can be determined using measured bit error rates for the adjacent wordlines. In such instances, the processing logic can first identify the adjacent wordlines to the source wordline, where the source wordline is located between the two adjacent wordlines. For example, if the source wordline is the third wordline in the data block, the processing logic can identify the second wordline and the fourth wordline in the block (the two wordlines most adjacent to the third wordline). Subsequently, the processing logic can determine whether the source wordline has a low bit error rate and the two adjacent wordlines have a high bit error rate, which can indicate high levels of read disturb for the adjacent wordlines.

To make this determination, the processing logic can determine a bit error rate associated with at least a portion of the memory cells of the source wordline, a second bit error rate associated with at least a portion of the memory cells of one adjacent wordline and a third bit error rate associated with at least a portion of the memory cells of the other adjacent wordline. The processing logic can then determine whether the bit error rates for the two adjacent wordlines satisfy a threshold criterion associated with a high read disturb condition. In various implementations, the threshold criterion can indicate a number of errors encountered, a percentage value, or the like. If the bit error rates for the adjacent wordlines (the second and third bit error rates) satisfy the threshold, the processing logic can determine if the bit error rate of the source wordline also satisfies the threshold. If the bit error rate for the source wordline is low and the bit error rates for the adjacent wordlines is high, this can indicate that high levels of read disturb are present the adjacent wordlines. In such instances, the processing logic can determine that the source wordline includes highly read data that should be relocated to low read disturb pages in the destination wordline.

At operation 240, the processing logic, responsive to determining that the data includes the characteristic that satisfies the threshold criterion (e.g., the data is highly read data), identifies one or more low read disturb pages of a target wordline for relocating the data. As noted above, a low read disturb page can be used for programming a most significant bit of a memory cell. In MLC implementations, processing logic can identify one or more upper pages of the MLC memory cell since that page is used for programming a most significant bit. In TLC implementations, processing logic can identify one or more extra pages of the TLC memory cell since that page is used for programming a most significant bit.

In some implementations, the processing logic can store the highly read data from the original source wordline across multiple target wordlines. In such instances, the processing logic can identify one group additional low read disturb pages on one target wordline in the target data block and an additional group of low read disturb pages on another target wordline. Subsequently, the processing logic can store the different portions of the highly read data across the multiple groups of low read disturb pages of the target wordlines. In one example, the processing logic can divide the highly read data across two wordlines. In another example, the processing logic can divide the highly read data across more than two wordlines.

In some implementations, the processing logic can select a target wordline for storing the highly read data that is not adjacent to other wordlines that could be negatively impacted by the highly read (e.g., "weak" wordlines). In such instances, after selecting a potential target wordline, the processing logic can identify a wordline that is adjacent to the potential target wordline. Subsequently, processing logic can determine a bit error rate associated with at least a portion of the memory cells for the adjacent wordline. The processing logic can determine whether this bit error rate satisfies a threshold criterion, and if so, designate that wordline as a "weak" wordline. In various implementations, the threshold criterion can be associated with a high error rate condition, a high voltage level, or the like. If processing logic determines that the adjacent wordline is a "weak" wordline, processing logic can identify another potential target wordline that is not adjacent to the "weak" wordline. In various implementations, the processing logic can identify any "weak" wordlines in the target data block first, then select a target wordline for the highly read data that is not adjacent to any of the "weak" wordlines in the target data block.

At operation 250, the processing logic, responsive to identifying the one or more low read disturb pages of the target wordline, stores at least a portion of the data at the one or more low read disturb pages of the target wordline. As noted above, in some implementations, the processing logic can store the highly read data at low read disturb pages of a single target wordline. Alternatively, the processing logic can store the highly read data at low read disturb pages of multiple target wordlines.

Figure 3A:
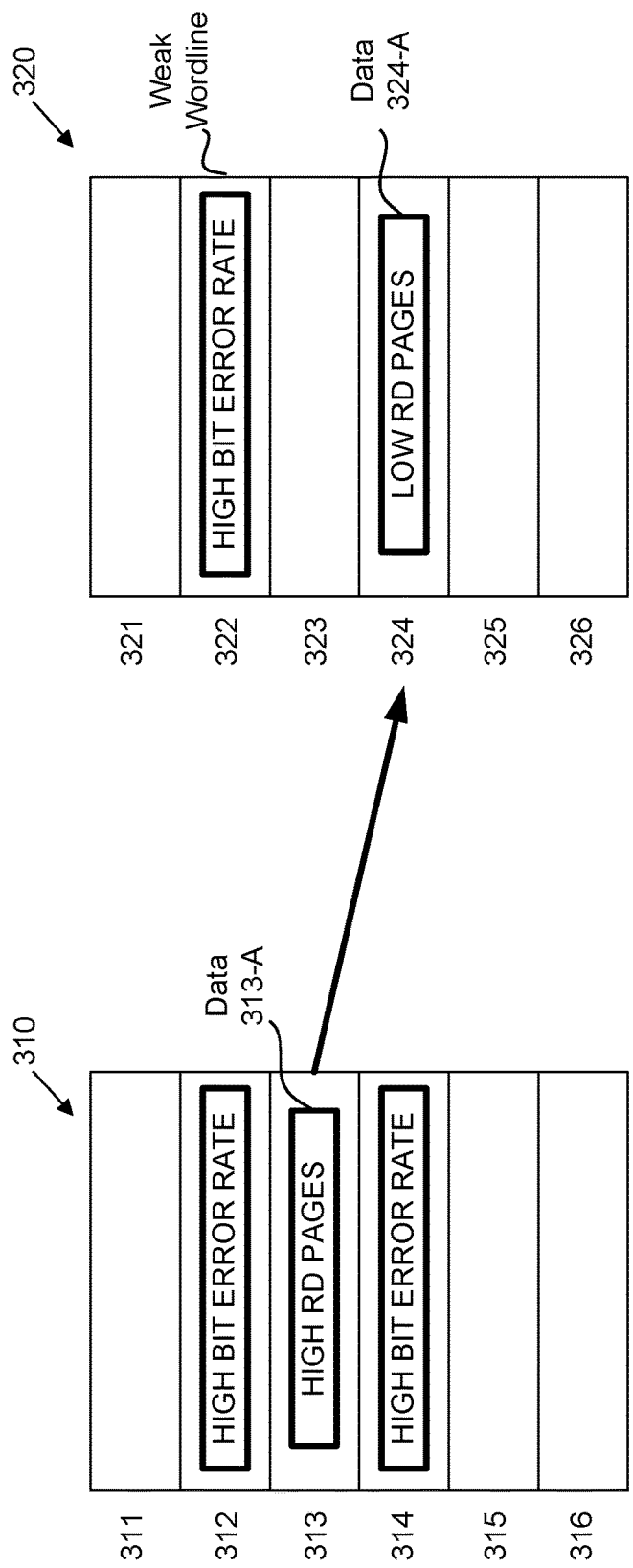
FIGS. 3A-3B illustrate examples of relocating highly read data to low impact read disturb pages of a memory device, in accordance with some embodiments of the present disclosure.
Figure 3B:
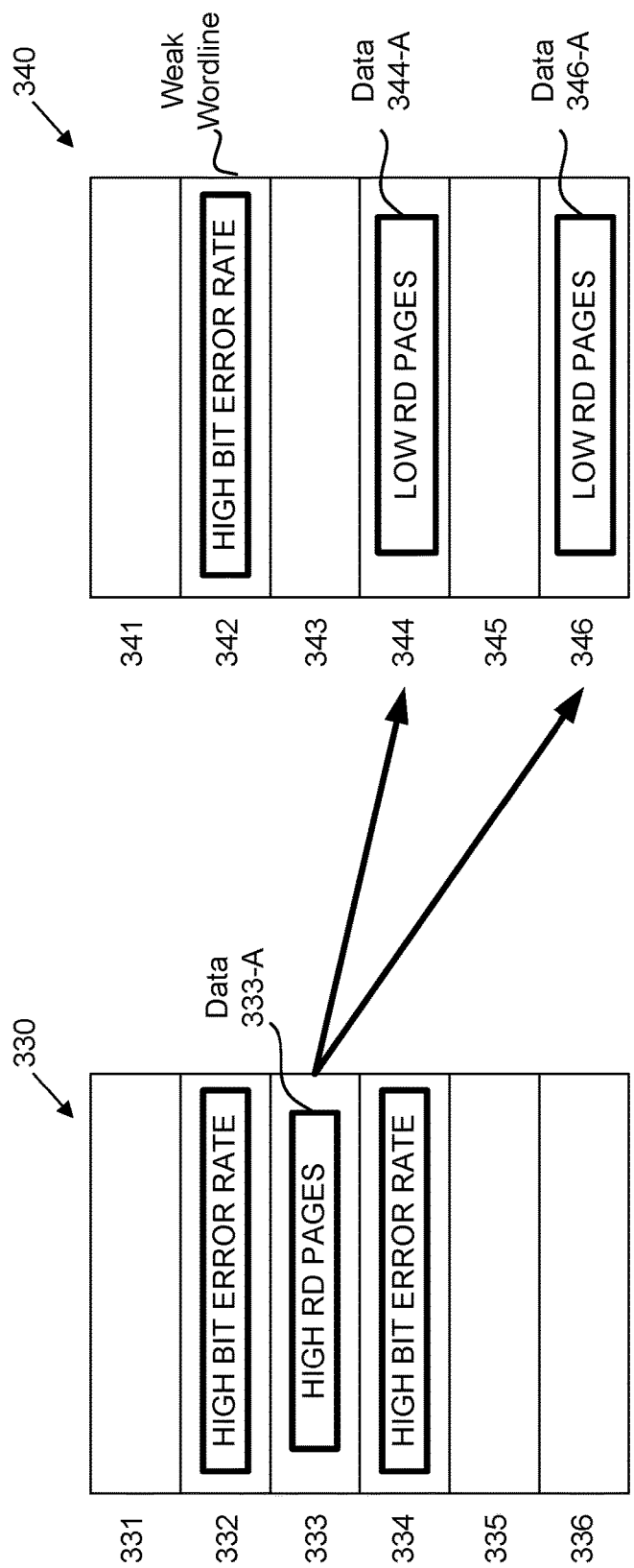

FIGS. 3A-3B illustrate examples of relocating highly read data to low impact read disturb pages of a memory device (e.g., memory device 130 of FIG. 1), in accordance with some embodiments of the present disclosure. In various implementations, data relocation operation can be performed by the highly read data manager 113 of FIG. 1 as described above with respect to FIG. 2 and below with respect to FIG. 4.

As shown in FIG. 3A, a highly read data manager can receive a request to perform a data relocation operation on wordlines of a source data block 310 of a memory device. As noted above, the request can be initiated in response to a garbage collection operation, a data folding operation, or the like. In various implementations, the highly read data manager can analyze the wordlines of the source block 310 (e.g., wordlines 311-316) to determine whether the data stored on any of the wordlines is highly read (e.g., "hot read") data and if so whether that highly read data can be relocated to low read disturb pages of a destination wordline to reduce the impact of read disturb on adjacent wordlines.

Responsive to receiving the request to perform the data relocation operation, the highly read data manager can determine whether data in a source wordline is highly read in order to direct its relocation efficiently. As shown, the highly read data manager can detect that the data stored at wordline 313 (data 313-A) is stored at high read disturb (RD) pages of the memory cells of that wordline. As noted above, in some implementations, the highly read data manager can determine whether data 313-A is highly read (e.g., "hot read") based on the attributes of the adjacent wordlines (e.g., wordlines 312 and 314). As shown in FIG. 3A, the bit error rates associated with the memory cells of wordlines 312 and 314 indicate high bit error rates. The presence of high bit error rates can indicate that these wordlines are experiencing high levels of read disturb. As noted above, this can be a result of the higher voltage levels applied to these wordlines when reading the data from wordline 313. The high bit error rates present for these wordlines can indicate that the data stored at wordline 313 is highly read.

The highly read data manager can then identify a target wordline in a target data block 320. As shown in FIG. 3A, the highly read data manager can identify wordlines in data block 320 with low bit error rates as potential target candidates. Subsequently, any candidate wordline that is adjacent to a weak wordline (e.g., a wordline with a high bit error rate) can be eliminated from consideration for relocating the highly read data. As shown, wordline 322 has a high bit error rate associated with its memory cells and is designated a weak wordline, causing the highly read data manager to eliminate wordline 321 and 323 from consideration. As shown, wordline 324 is selected as the target wordline and the data 313-A is relocated to the low read disturb (RD) pages of wordline 324 (e.g., data 324-A).

FIG. 3B. illustrates relocating highly read data to low read disturb pages of multiple target wordlines. As shown, the highly read data manager can receive a request to perform a data relocation operation on wordlines of a source data block 330 of a memory device. As noted above, the request can be initiated in response to a garbage collection operation, a data folding operation, or the like. In various implementations, the highly read data manager can analyze the wordlines of the source block 330 (e.g., wordlines 331-336) to determine whether the data stored on any of the wordlines is highly read (e.g., "hot read") data and if so whether that highly read data can be relocated to low read disturb pages of a destination wordline to reduce the impact of read disturb on adjacent wordlines. The highly read data manager can utilize a similar process as that described in FIG. 2 and FIG. 3A for detecting highly read data for relocation to low read disturb pages of target wordlines of target data blocks.

As shown in FIG. 3B, the highly read data manager can determine that the data 333-A stored at wordline 333 is highly read data based on determining that the adjacent wordlines 332 and 334 are affected by high levels of read disturb. As described above, this can be determined by determining bit error rates for the memory cells of wordlines 332 and 334. As shown, the bit error rates associated with the memory cells of these adjacent wordlines are high, indicating that data 333-A is highly read data. As shown, the highly read data manager can relocate the data 333-A to multiple target wordlines. The highly read data manager can select target wordlines that are not adjacent to weak wordlines (e.g., wordline 342) and store it in the low read disturb pages of those wordlines (344-A, 346-A).

It should be noted that while FIGS. 3A-3B depict source and destination blocks with a particular number of wordlines, aspects of the present disclosure can be applied to memory devices configured with data blocks that include more or fewer wordlines. Additionally, while FIGS. 3A-3B depict the relocation of data already programmed to a memory device, aspects of the present disclosure can be applied to programming new data on first instance based on a write request received from a host system. This latter embodiment is described in further detail below with respect to FIG. 4.

Figure 4:
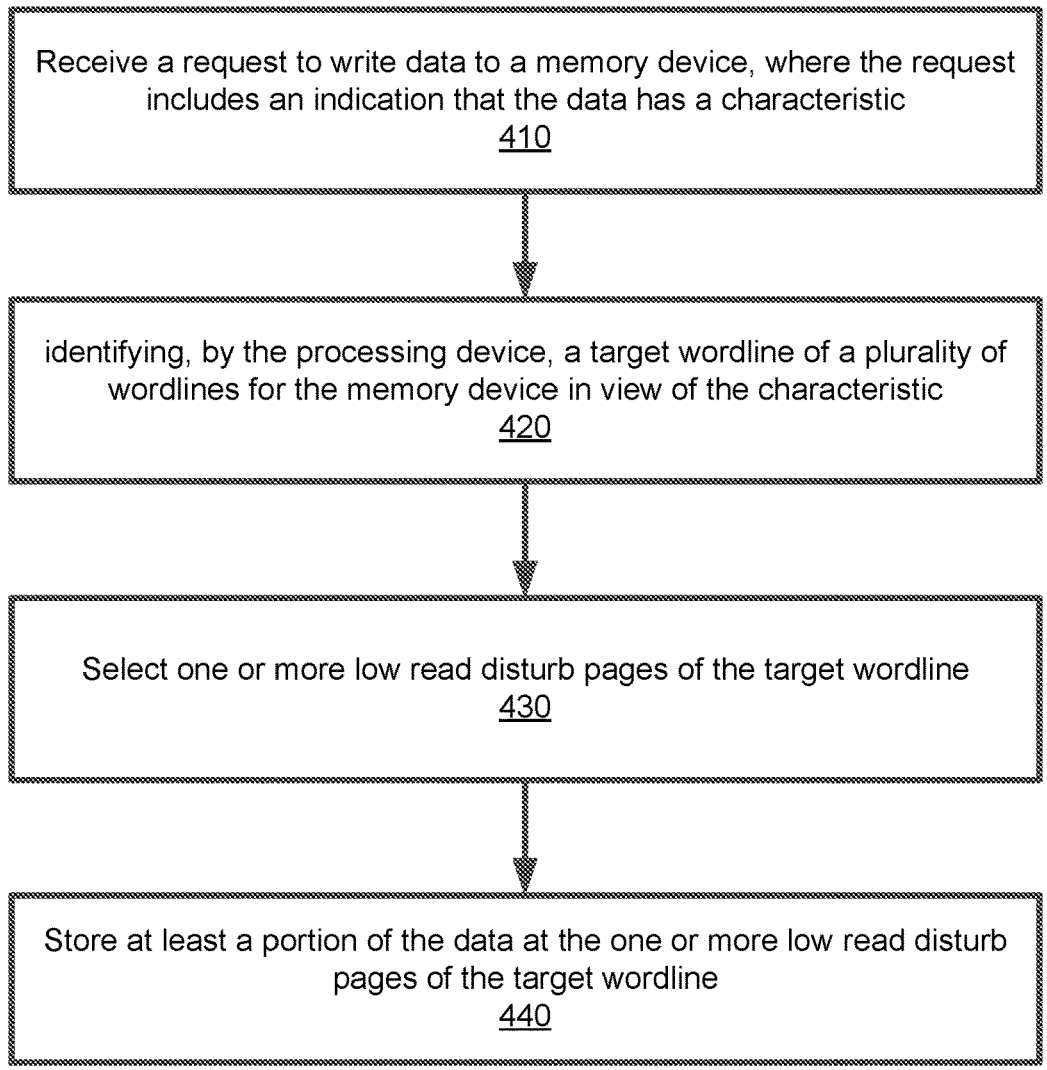
FIG. 4 is a flow diagram of an example method to storing highly read data at low impact read disturb pages of a memory device based on a write request, in accordance with some embodiments of the present disclosure.

FIG. 4 is a flow diagram of an example method 400 for storing highly read data at low impact read disturb pages of a memory device based on a write request, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the highly read data manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a request to write data to a memory device, where the request includes an indication that the data includes a particular characteristic. In various implementations, the characteristic can be associated with data to be written is likely to be highly read data. In such instances, the system providing the data (e.g., a host system) can predetermine that the data could be accessed more often than other data and configure the write request to indicate that characteristic in the request. For example, the data may include frequently accessed values such as lookup table values, configuration values, conversion constants, or the like. In some implementations, the request can provide this indication by setting a flag or indicator in the request to a value that indicates the accompanying data will be highly read data. As noted above, the memory device can include multi-level memory cells. Each multi-level memory cell can be configured with different page levels, where each page level can be used to store a particular significant bit level for the memory cell. For example, a memory device configured with multi-level cells (MLCs) can store two bits per cell. In such instances, an MLC can include a lower page for programming a least significant bit and a higher page (or upper page) for programming a most significant bit for the MLC. Similarly, a memory device configured with triple-level cells (TLCs) can store three bits per cell. In such instances, a TLC can include a lower page for programming a least significant bit and a multiple higher pages—an upper page for programming a second significant bit and an extra page for programming the most significant bit for the TLC.

At operation 420, the processing logic identifies a target wordline for storing the data in a data block of the memory device in view of the characteristic. As noted above, a characteristic associated with data that is likely to be frequently accessed (e.g., highly read) in relation to other data can direct the processing logic to select a target wordline accordingly. In various implementations, the processing logic can select a potential target wordline based on whether that potential target is a weak wordline. As noted above with respect to FIG. 2, a high bit error rate for a wordline can indicate that the wordline is a weak wordline. In such instances, the processing logic can identify a potential target wordline and determine a bit error rate for at least a portion of the memory cells for that wordline. Subsequently, processing logic can determine whether the determined bit error rate satisfies a threshold criterion. In various implementations, the threshold criterion can be associated with a high error rate condition, a high voltage level, or the like. Responsive to determining that the bit error rate does not satisfy the threshold criterion, the processing logic can select that wordline as the target for storing the data. Otherwise, the processing logic can identify another wordline as the target.

In some implementations, the processing logic can also consider the wordlines that are adjacent to a potential target wordline. As noted above, the processing logic can bypass potential target wordlines that are adjacent to weak wordlines since highly read data can negatively impact adjacent weak wordlines. In such instances, the processing logic perform a process similar to that described above with respect to FIG. 2. Subsequent to selecting a potential target wordline, the processing logic can identify an adjacent wordline to the potential target, determine a bit error rates for at least a portion of the memory cells for the adjacent wordline, and determine whether that bit error rate satisfies the threshold criterion. If so, the processing logic can determine that the adjacent wordline is a weak wordline and subsequently identify another potential target for storing the highly read data.

In some implementations, the processing logic can store the highly read data across multiple wordlines. In such instances, the processing logic can follow the above process to identify multiple wordlines in the data block (or in multiple data blocks) for storing the highly read data.

At operation 430, the processing logic selects one or more low read disturb pages of the target wordline for storing the data. As noted above, a low read disturb page can be used for programming a most significant bit of a memory cell. In MLC implementations, processing logic can identify one or more upper pages of the MLC memory cell since that page is used for programming a most significant bit. In TLC implementations, processing logic can identify one or more extra pages of the TLC memory cell since that page is used for programming a most significant bit. In instances, where multiple target wordlines are selected for storing the data, a group of low read disturb pages for each of the target wordlines are selected.

At operation 440, the processing logic stores at least a portion of the data at the one or more low read disturb pages of the target wordline. In instances where a single wordline is selected, the data is stored at the low read disturb pages of that wordline. In instances, where multiple wordlines are selected, the data is stored at the low read disturb pages of each of the wordlines.

Figure 5:
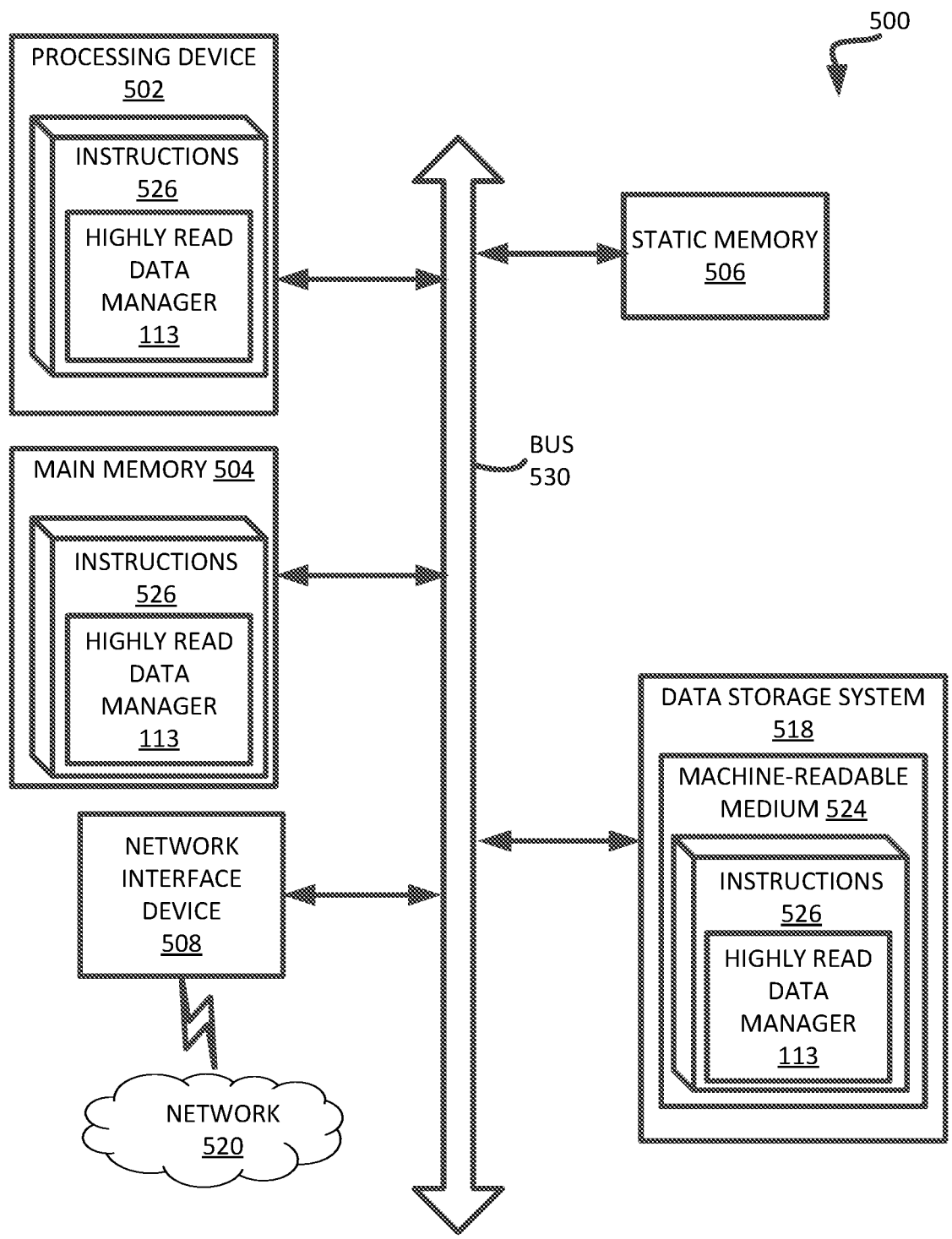
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the highly read data manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 626 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a highly read data manager (e.g., the highly read data manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving, by a processing device, a request to perform a data relocation operation on a first wordline of a plurality of wordlines for a memory device, the memory device comprising a plurality of multi-level memory cells, wherein each multi-level memory cell comprises a plurality of pages;
determining that the first wordline comprises data stored at one or more high read disturb pages of the plurality of pages;
determining whether the data comprises a characteristic that satisfies a threshold criterion in relation to additional data stored on additional wordlines of the plurality of wordlines;
responsive to determining that the data comprises the characteristic that satisfies the threshold criterion, identifying a target wordline in a non-empty target data block for relocating the data;
determining whether any wordline adjacent to the target wordline has a bit error rate that exceeds a corresponding threshold; and
responsive to determining that there are no wordlines adjacent to the target wordline having a bit error rate that exceeds the corresponding threshold, storing at least a portion of the data at one or more low read disturb pages of the target wordline.

2. The method of claim 1, wherein the data relocation operation comprises at least one of a garbage collection operation or a folding operation.

3. The method of claim 1, wherein the one or more high read disturb pages have suffered more read disturb than the one or more low read disturb pages.

4. The method of claim 1, wherein determining whether the data comprises the first characteristic that satisfies the threshold criterion comprises:
identifying a second wordline of the plurality of wordlines, wherein the second wordline is adjacent to the first wordline; and
identifying a third wordline of the plurality of wordlines, wherein the third wordline is adjacent to the first wordline, and wherein the first wordline is between the second wordline and the third wordline.

5. The method of claim 4, further comprising:
determining a first bit error rate associated with at least a portion of the memory cells of the first wordline;
determining a second bit error rate associated with at least a portion of the memory cells of the second wordline;

determining a third bit error rate associated with at least a portion of the memory cells of the third wordline;

determining whether the second bit error rate and the third bit error rate satisfy a threshold criterion associated with a high read disturb condition;

responsive to determining that the second bit error rate and the third bit error rate satisfy the threshold criterion, determining whether the first bit error rate satisfies the threshold criterion; and responsive to determining that the first bit error rate does not satisfy the threshold criterion, determining that the first wordline comprises data with the characteristic.

6. The method of claim 1, whether the data comprises the characteristic that satisfies the threshold criterion comprises:

determining a read count associated with the first wordline, wherein the read count comprises an indication of a number of host read operations performed on the memory cells of the first wordline;

determining whether the read count satisfies a read threshold criterion associated with a highly read data condition; and responsive to determining that the read count satisfies the read threshold criterion, determining that the first wordline comprises data with the characteristic.

7. The method of claim 1, further comprising:

identifying one or more additional low read disturb pages of an additional target wordline; and storing an additional portion of the data at the one or more additional low read disturb pages of the additional target wordline.

8. The method of claim 1, further comprising:

identifying a second target wordline, wherein the second target wordline is adjacent to the target wordline;

determining a bit error rate associated with at least a portion of the memory cells of the second target wordline;

determining whether the bit error rate satisfies a threshold criterion associated with a high error rate condition; and responsive to determining that the bit error rate satisfies the threshold criterion, identifying one or more additional low read disturb pages of an additional target wordline for relocating the data, wherein the additional target wordline is not adjacent to the second target wordline.

9. A method comprising:

receiving, by a processing device, a request to write data to a memory device, wherein the request comprises an indication that the data has a characteristic, wherein the memory device comprises a plurality of multi-level memory cells, and wherein each multi-level memory cell comprises a plurality of pages;

identifying, by the processing device, a target wordline of a plurality of wordlines in a non-empty target data block of the memory device in view of the characteristic;

determining, whether any wordline adjacent to the target wordline has a bit error rate that exceeds a corresponding threshold;

responsive to determining that there are no wordlines adjacent to the target wordline having a bit error rate that exceeds the corresponding threshold, selecting one or more low read disturb pages of the plurality of pages of the target wordline; and storing at least a portion of the data at the one or more low read disturb pages of the target wordline.

10. The method of claim 9, wherein the one or more low read disturb pages have suffered less read disturb than one or more high read disturb pages of the plurality of pages.

11. The method of claim 9, wherein identifying the target wordline comprises:

identifying a first wordline of the plurality of wordlines;

determining a first bit error rate associated with at least a portion of the memory cells of the first wordline;

determining whether the first bit error rate satisfies a threshold criterion associated with a high error rate condition; and responsive to determining that the bit error rate does not satisfy the threshold criterion, selecting the first wordline as the target wordline for storing the data.

12. The method of claim 11, further comprising:

identifying a second wordline of the plurality of wordlines, wherein the second wordline is adjacent to the first wordline;

determining a second bit error rate associated with at least a portion of the memory cells of the second wordline;

determining whether the second bit error rate satisfies the threshold criterion; and responsive to determining that the second bit error rate satisfies the threshold criterion, identifying an additional target wordline for storing the data, wherein the additional wordline is not adjacent to the second wordline.

13. The method of claim 9, further comprising:

identifying one or more additional low read disturb pages of an additional target wordline; and storing an additional portion of the data at the one or more additional low read disturb pages of the additional target wordline.

14. A system comprising:

a memory device; and a processing device, operatively coupled with the memory device to perform operations comprising:

receiving, by a processing device, a request to perform a data relocation operation on a first wordline of a plurality of wordlines for a memory device, the memory device comprising a plurality of multi-level memory cells, wherein each multi-level memory cell comprises a plurality of pages;

determining that the first wordline comprises data stored at one or more high read disturb pages of the plurality of pages;

determining whether the data comprises a characteristic that satisfies a threshold criterion in relation to additional data stored on additional wordlines of the plurality of wordlines;

responsive to determining that the data comprises the characteristic that satisfies the threshold criterion, identifying a target wordline in a non-empty target data block for relocating the data;

determining whether any wordline adjacent to the target wordline has a bit error rate that exceeds a corresponding threshold; and responsive to determining that there are no wordlines adjacent to the target wordline having a bit error rate that exceeds the corresponding threshold, storing at least a portion of the data at one or more low read disturb pages of the target wordline.

15. The system of claim 14, wherein the one or more high read disturb pages have suffered more read disturb than the one or more low read disturb pages.

16. The system of claim 14, wherein to determine whether the data comprises the characteristic that satisfies the threshold criterion, the processing device is to perform further operations comprising:
   identifying a second wordline of the plurality of wordlines, wherein the second wordline is adjacent to the first wordline; and
   identifying a third wordline of the plurality of wordlines, wherein the third wordline is adjacent to the first wordline, and wherein the first wordline is between the second wordline and the third wordline.

17. The system of claim 16, wherein the processing device is to perform further operations comprising:
   determining a first bit error rate associated with at least a portion of the memory cells of the first wordline;
   determining a second bit error rate associated with at least a portion of the memory cells of the second wordline;
   determining a third bit error rate associated with at least a portion of the memory cells of the third wordline;
   determining whether the second bit error rate and the third bit error rate satisfy a threshold criterion associated with a high read disturb condition;
   responsive to determining that the second bit error rate and the third bit error rate satisfy the threshold criterion, determining whether the first bit error rate satisfies the threshold criterion; and
   responsive to determining that the first bit error rate does not satisfy the threshold criterion, determining that the first wordline comprises data with the characteristic.

18. The system of claim 14, wherein to determine whether the data comprises the characteristic that satisfies the threshold criterion, the processing device is to perform further operations comprising:
   determining a read count associated with the first wordline, wherein the read count comprises an indication of a number of host read operations performed on the memory cells of the first wordline;
   determining whether the read count satisfies a read threshold criterion associated with a highly read data condition; and
   responsive to determining that the read count satisfies the read threshold criterion, determining that the first wordline comprises data with the characteristic.

19. The system of claim 14, wherein the processing device is to perform further operations comprising:
   identifying one or more additional low read disturb pages of an additional target wordline; and
   storing an additional portion of the data at the one or more additional low read disturb pages of the additional target wordline.

20. The system of claim 14, wherein the processing device is to perform further operations comprising:
   identifying a second target wordline, wherein the second target wordline is adjacent to the target wordline;
   determining a bit error rate associated with at least a portion of the memory cells of the second target wordline;
   determining whether the bit error rate satisfies a threshold criterion associated with a high error rate condition; and
   responsive to determining that the bit error rate satisfies the threshold criterion, identifying one or more additional low read disturb pages of an additional target wordline for relocating the data, wherein the additional target wordline is not adjacent to the second target wordline.

* * * * *